(12) United States Patent
Tani et al.

(10) Patent No.: US 9,059,324 B2
(45) Date of Patent: Jun. 16, 2015

(54) BI-DIRECTIONAL ESD DIODE STRUCTURE WITH ULTRA-LOW CAPACITANCE THAT CONSUMES A SMALL AMOUNT OF SILICON REAL ESTATE

(71) Applicant: Texas Instruments Incorporated, Dallas, TX (US)

(72) Inventors: Toshiyuki Tani, Hayami-Gun (JP); Akihiko Yamashita, Oita (JP); Motoaki Kusamaki, Beppu (JP); Kentaro Takahashi, Tokyo (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/931,936

(22) Filed: Jun. 30, 2013

(65) Prior Publication Data

US 2015/0001672 A1    Jan. 1, 2015

(51) Int. Cl.
*H01L 27/02* (2006.01)
*H01L 29/06* (2006.01)
*H01L 29/66* (2006.01)
*H01L 29/861* (2006.01)
*H01L 21/762* (2006.01)

(52) U.S. Cl.
CPC ...... *H01L 29/8618* (2013.01); *H01L 21/76224* (2013.01); *H01L 27/0255* (2013.01); *H01L 29/0649* (2013.01); *H01L 29/66136* (2013.01); *H01L 29/6609* (2013.01); *H01L 29/861* (2013.01)

(58) Field of Classification Search
CPC ............ H01L 27/0255; H01L 29/0649; H01L 29/8618; H01L 29/33136
USPC ......... 257/110, 119–123, 126–127, 129–131, 257/E29.215, E29.327
See application file for complete search history.

(56) References Cited

U.S. PATENT DOCUMENTS

| 5,298,769 | A  | * | 3/1994  | Omura et al. ................. 257/138 |
| 6,066,863 | A  | * | 5/2000  | Fujishima ..................... 257/133 |
| 6,472,686 | B1 | * | 10/2002 | Shah ............................. 257/77  |
| 6,501,099 | B2 | * | 12/2002 | Shah ............................. 257/77  |
| 6,552,370 | B2 | * | 4/2003  | Pezzani ........................ 257/107 |
| 6,555,849 | B1 | * | 4/2003  | Schuh et al. ................. 257/130 |
| 6,614,055 | B1 | * | 9/2003  | Kusuda et al. ................ 257/79  |
| 6,674,129 | B1 | * | 1/2004  | Colclaser et al. ............ 257/355 |
| 6,794,631 | B2 | * | 9/2004  | Clark .......................... 250/214.1 |
| 6,835,993 | B2 | * | 12/2004 | Sridevan et al. ............. 257/492 |
| 7,126,166 | B2 | * | 10/2006 | Nair et al. ..................... 257/110 |
| 7,301,178 | B2 | * | 11/2007 | Yamaguchi et al. ......... 257/131 |
| 7,804,150 | B2 | * | 9/2010  | Jeon et al. .................... 257/492 |
| 8,304,827 | B2 | * | 11/2012 | Nakamura et al. ........... 257/328 |
| 8,455,946 | B2 | * | 6/2013  | Lin et al. ...................... 257/331 |
| 8,536,682 | B2 | * | 9/2013  | Morillon ....................... 257/603 |
| 2007/0238208 | A1 | * | 10/2007 | Nishida et al. ................. 438/29  |
| 2012/0146089 | A1 | * | 6/2012  | Menard et al. ................ 257/119 |

* cited by examiner

*Primary Examiner* — Ida M Soward
(74) *Attorney, Agent, or Firm* — Jacqueline J. Garner; Frank Cimino

(57) ABSTRACT

A bi-directional electrostatic discharge diode structure consumes substantially less silicon real estate and provides ultra-low capacitance by utilizing a p– epitaxial layer that touches and lies between an n+ lower epitaxial layer and an n+ upper epitaxial layer. A metal contact touches and lies over a p+ layer, which touches and lies over the n+ upper epitaxial layer.

15 Claims, 6 Drawing Sheets

BI-DIRECTIONAL ESD DIODE STRUCTURE WITH ULTRA-LOW CAPACITANCE THAT CONSUMES A SMALL AMOUNT OF SILICON REAL ESTATE

BACKGROUND OF THE INVENTION

1. Field of the Invention

The present invention relates to bi-directional ESD diode structures and, more particularly, to a bi-directional ESD diode structure with ultra-low capacitance that consumes a small amount of silicon real estate.

2. Description of the Related Art

An electrostatic discharge (ESD) circuit is a circuit that protects an integrated circuit from voltage spikes, which commonly occur when the integrated circuit is handled. In operation, an ESD circuit provides an open circuit between a first node and a second node when the voltage difference across the first and second nodes is less than a breakdown voltage.

However, when the voltage difference across the first and second nodes spikes up to be equal to or greater than the breakdown voltage, the ESD circuit provides a low-resistance current path between the first and second nodes. A bi-directional ESD circuit provides protection regardless of whether the voltage on the first node rises with respect to the second node, or the voltage on the second node rises with respect to the first node.

Conventional bi-directional ESD circuits typically include a combination of Zener diodes and high-breakdown-voltage avalanche diodes. One of the drawbacks to utilizing a conventional combination of Zener and avalanche diodes is that the metal lead, which is required to connect the Zener and avalanche diodes together, consumes a large amount of silicon real estate.

FIG. 1 shows a cross-sectional view that illustrates an example of a prior-art bi-directional ESD diode structure 100. As shown in FIG. 1, diode structure 100 includes a p+ substrate region 110, an n+ epitaxial region 112 that touches the top surface of p+ substrate region 110, and a p+ region 114 that touches the top surface of n+ epitaxial region 112.

Diode structure 100 also includes a trench isolation structure 116 that laterally surrounds a portion of p+ substrate region 110, n+ epitaxial region 112, and p+ region 114. Diode structure 100 further includes a non-conductive layer 120 that touches and lies over p+ region 114, and a metal contact 122 that touches and extends through non-conductive layer 120 to make an electrical connection to p+ region 114. In addition, diode structure 100 includes a non-conductive layer 124 that touches and lies over non-conductive layer 120 and metal contact 122. Further, non-conductive layer 124 has an opening 130 that exposes metal contact 122.

In operation, p+ region 114 forms the anode and n+ epitaxial region 112 forms the cathode of a top Zener diode, while p+ substrate region 110 forms the anode and n+ epitaxial region 112 forms the cathode of a bottom Zener diode, where the cathodes of the two diodes are connected together.

Thus, when the voltage on metal contact 122 spikes up with respect to the voltage on p+ substrate region 110 and exceeds the breakdown voltage of the bottom Zener diode, a discharge current flows from metal contact 122 to p+ substrate region 110. On the other hand, when the voltage on p+ substrate region 110 spikes up with respect to the voltage on metal contact 122 and exceeds the breakdown voltage of the top Zener diode, a discharge current flows from p+ substrate region 110 to metal contact 122.

One of the advantages of diode structure 100 is that diode structure 100 consumes much less silicon real estate than a conventional combination of Zener and avalanche diodes. However, one of the disadvantages of diode structure 100 is that diode structure 100 has a much higher capacitance than a conventional combination of Zener and avalanche diodes.

For example, the dopant concentrations of substrate region 110, n+ epitaxial region 112, and p+ region 114 can be selected so that diode structure 100 has a capacitance of 14.7 pF, the top Zener diode has a breakdown voltage of −6.5V, and the bottom Zener diode has a breakdown voltage of +11V. Diode structures with a higher capacitance, however, cannot be used with high-speed signal applications, such as USB 3.0 and HDMI 1.4. Thus, there is a need for a bi-directional ESD diode structure with a low capacitance that also consumes a small amount of silicon real estate.

SUMMARY OF THE INVENTION

The present invention provides a diode structure that consumes a small amount of silicon real estate and provides ultra-low capacitance. A diode structure of the present invention includes a substrate region of a first conductivity type. The substrate region has a dopant concentration. The diode structure also includes a first semiconductor layer of a second conductivity type. The first semiconductor layer has a dopant concentration, and touches and lies over the substrate region. The diode structure additionally includes a second semiconductor layer of the first conductivity type. The second semiconductor layer touches and lies over the first semiconductor layer. The second semiconductor layer has a dopant concentration that is substantially less than the dopant concentration of the substrate region. The diode structure further includes a third semiconductor layer of the second conductivity type. The third semiconductor layer touches and lies over the second semiconductor layer. In addition, the diode structure includes a fourth semiconductor layer of the first conductivity type. The fourth semiconductor touches and lies over the third semiconductor layer.

The present invention also provides a method of forming a diode structure with ultra-low capacitance and a small size. The method of the present invention includes epitaxially growing a first semiconductor layer on a substrate region. The substrate region has a first conductivity type and a dopant concentration. The first semiconductor layer has a second conductivity type and a dopant concentration. The method also includes epitaxially growing a second semiconductor layer on the first semiconductor layer. The second semiconductor layer has the first conductivity type and a dopant concentration that is substantially less than the dopant concentration of the substrate region. The method further includes epitaxially growing a third semiconductor layer on the second semiconductor layer. The third semiconductor layer has the second conductivity type.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

Figure 1:
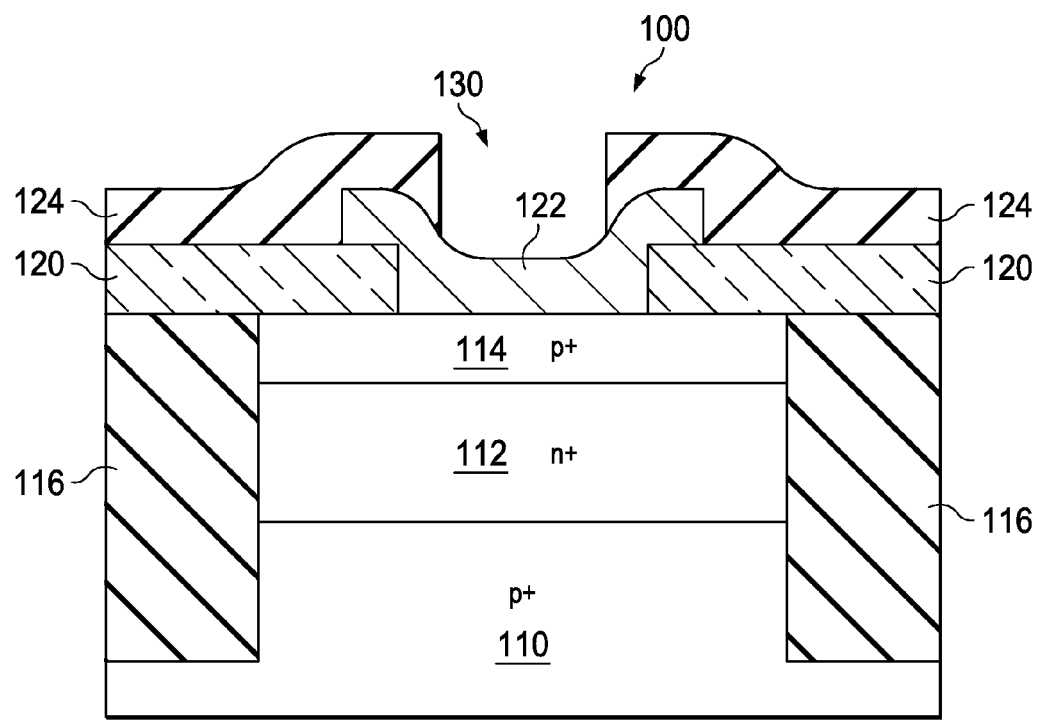
FIG. 1 is a cross-sectional view illustrating an example of a prior-art bi-directional ESD diode structure 100.
Figure 2:
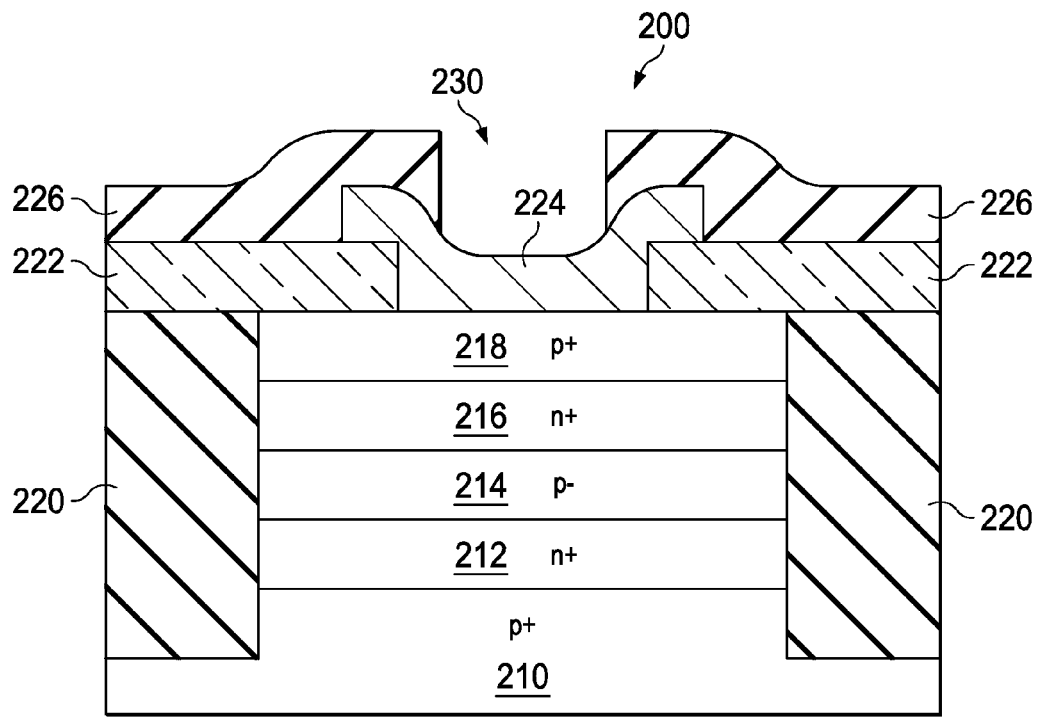
FIG. 2 is a cross-sectional view illustrating an example of a bi-directional ESD diode structure 200 in accordance with the present invention.

FIG. 2 shows a cross-sectional view that illustrates an example of a bi-directional ESD diode structure 200 in accordance with the present invention. As described in greater detail below, the capacitance of diode structure 100 is substantially reduced by forming a p– epitaxial layer to lie in-between two n+ epitaxial layers.

As shown in FIG. 2, ESD diode structure 200 includes a p+ single-crystal-silicon substrate region 210, an n+ epitaxial region 212 that touches the top surface of p+ substrate region 110, and a p– region 214 that touches the top surface of n+ epitaxial region 112. ESD diode structure 200 also includes an n+ epitaxial region 216 that touches the top surface of p– epitaxial region 214, and a p+ region 218 that touches the top surface of n+ epitaxial region 216.

Diode structure 200 also includes a trench isolation structure 220 that laterally surrounds a portion of p+ substrate region 210, n+ epitaxial region 212, p– region 214, n+ epitaxial region 216, and p+ region 218. Diode structure 200 further includes non-conductive layer 222 that touches and lies over p+ region 218, and a metal contact 224 that touches and extends through non-conductive layer 222 to make an electrical connection to the portion of p+ region 218 that is surrounded by trench isolation structure 220. In addition, diode structure 200 includes a non-conductive layer 226 that touches and lies over non-conductive layer 222 and metal contact 224. Further, non-conductive layer 226 has an opening 230 that exposes metal contact 224.

Diode structure 200 operates the same as diode structure 100 except that diode structure 200 has a substantially lower capacitance. When the dopant concentrations of the p+ substrate regions 110 and 210 are substantially the same, the dopant concentrations of the n+ epitaxial regions 112, 212, and 216 are substantially the same, the dopant concentrations of the p+ regions 114 and 218 are substantially the same, and the dopant concentration of p– epitaxial region 214 is substantially less than the dopant concentrations of p+ region 218, diode structure 200 has a capacitance of 1.3 pF as compared to the 14.7 pF capacitance of diode structure 100.

In addition, the top diode in diode structure 200 has a breakdown voltage of –7.9V compared to the –6.5V breakdown voltage of the top diode in diode structure 100. Further, the bottom diode in diode structure 200 has a breakdown voltage of +15V compared to the +11V breakdown voltage of the top diode in diode structure 100. Thus, in addition to providing a substantially lower capacitance, the diodes in diode structure 200 also have greater breakdown voltages.

Figure 3A:
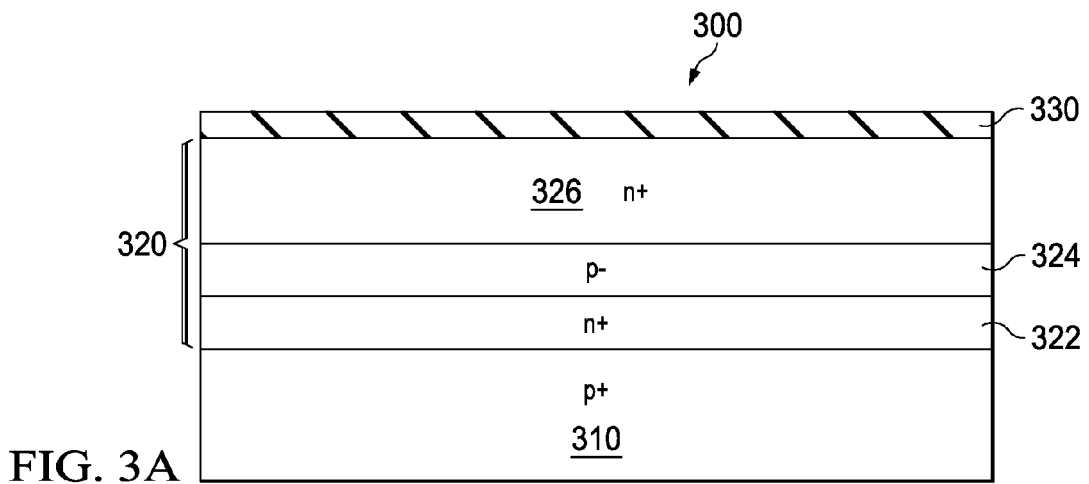
FIGS. 3A-3L are cross-sectional views illustrating an example of a method 300 of forming a bi-directional ESD diode structure in accordance with the present invention.

FIGS. 3A-3L show cross-sectional views that illustrate an example of a method 300 of forming a bi-directional ESD diode structure in accordance with the present invention. As shown in FIG. 3A, method 300 utilizes a conventionally-formed p+ single-crystal-silicon substrate region 310, and begins by growing an epitaxial structure 320 on the top surface of substrate region 310. (A hard mask can optionally be formed before epitaxial structure 320 is formed so that epitaxial structure 320 can be formed on only selected areas of a die.)

Epitaxial structure 320 is grown in a conventional manner to have an n+ lower epitaxial layer 322 that touches and lies over p+ substrate region 310, a p– middle epitaxial layer 324 that touches and lies over n+ lower epitaxial layer 322, and an n+ upper epitaxial layer 326 that touches and lies over p– middle epitaxial layer 324.

Further, arsenic, antimony, or phosphorous can be implanted and annealed after n+ lower epitaxial layer 322 has been formed, and before n+ upper epitaxial layer 326 is formed. Implanting arsenic, antimony, or phosphorous controls the dopant concentration of n+ lower epitaxial layer 322 which, in turn, allows a variety of breakdown voltages to be obtained.

In addition, arsenic, antimony, or phosphorous can also be implanted and annealed after n+ upper epitaxial layer 326 has been formed. Implanting arsenic, antimony, or phosphorous controls the dopant concentration of n+ upper epitaxial layer 326 which, in turn, allows a further variety of breakdown voltages to be obtained.

P– middle epitaxial layer 324 has a dopant concentration that is, for example, lower than $1 \times 10^{16}$ atoms/cm$^3$, while p+ substrate region 310 has a dopant concentration that is, for example, greater than $1 \times 10^{18}$ atoms/cm$^3$. In addition, p– middle epitaxial layer 324 lies completely between n+ lower epitaxial layer 322 and n+ upper epitaxial layer 326. After epitaxial structure 320 has been formed, a non-conductive layer 330, such as an oxide layer, is formed on the top surface of n+ upper epitaxial layer 326.

Figure 3B:
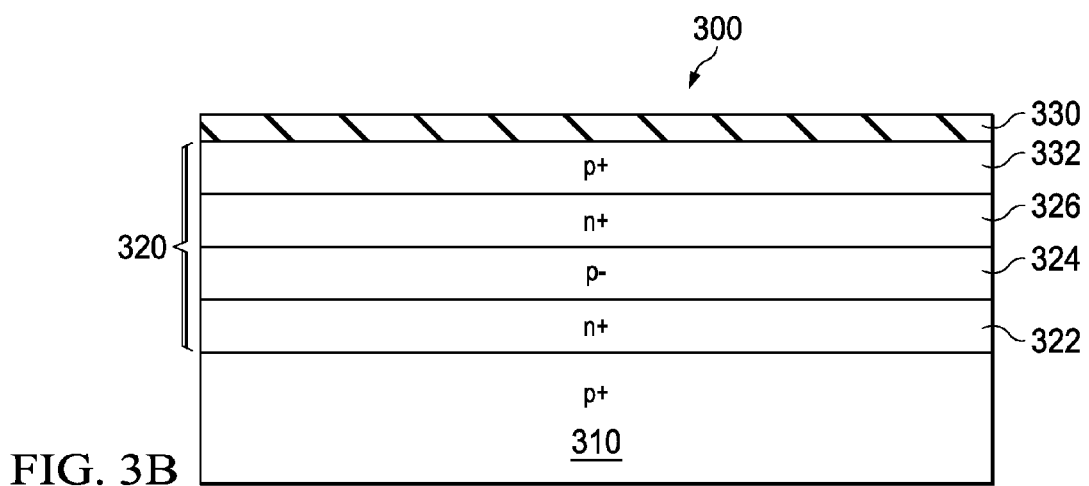

As shown in FIG. 3B, after non-conductive layer 330 has been formed, a p– type dopant is implanted into n+ upper epitaxial layer 326 through non-conductive layer 330 at a dose that is sufficient to convert the top portion of n+ upper epitaxial layer 326 into a p+ layer 332 that touches and lies above the remainder of n+ upper epitaxial layer 326. The implanted dopants are then diffused using a conventional approach. Further, n+ upper epitaxial layer 326 lies completely between p– middle epitaxial layer 324 and p+ layer 332.

Figure 3C:
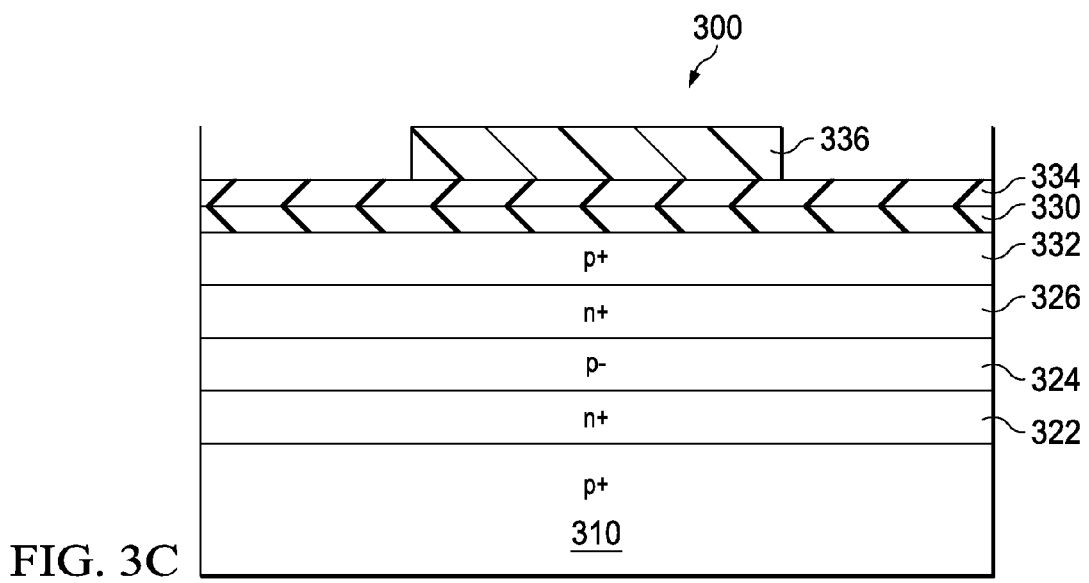

As shown in FIG. 3C, once the implant has been completed, a non-conductive layer 334 is formed on p+ layer 332. Non-conductive layer 334 can be implemented with, for example, tetraethyl orthosilicate (TEOS). TEOS can be deposited and then annealed for 20 minutes at 900° C. to make the film dense. Following this, a patterned photoresist layer 336 is formed on non-conductive layer 334.

Patterned photoresist layer 336 is formed in a conventional manner, which includes depositing a layer of photoresist, projecting a light through a patterned black/clear glass plate known as a mask to form a patterned image on the layer of photoresist to soften the photoresist regions exposed by the light, and removing the softened photoresist regions.

Figure 3D:
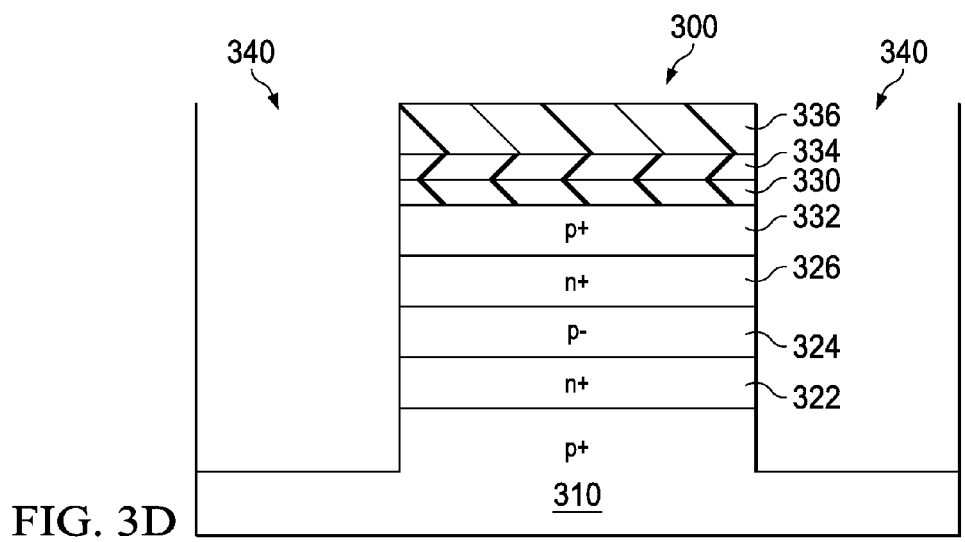

As shown in FIG. 3D, after patterned photoresist layer 336 has been formed, the exposed regions of non-conductive layer 334, non-conductive layer 330, p+ layer 332, n+ upper epitaxial layer 326, p– middle epitaxial layer 324, n+ lower epitaxial layer 322, and p+ substrate region 310 are etched in a conventional fashion to form a trench opening 340. Patterned photoresist layer 336 is then removed in a conventional manner, such as with an ash process.

Figure 3E:
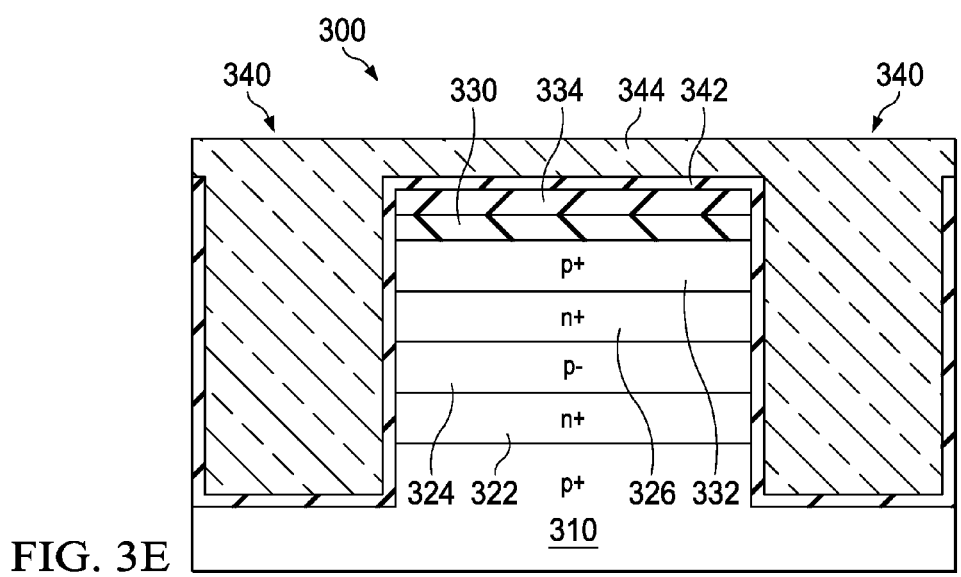

As shown in FIG. 3E, once patterned photoresist layer 336 has been removed, a non-conductive layer 342 is deposited in a conventional fashion on non-conductive layer 334 to line trench opening 340. Non-conductive layer 342 can be implemented with, for example, a layer of oxide followed by a layer of TEOS. Next, a layer of polycrystalline silicon 344 is deposited in a conventional manner on non-conductive layer 342 to fill up trench opening 340. (In the present example, polycrystalline silicon is formed on both the front and back of the wafer, and removed from the back of the wafer using well-known materials and methods, such as with a plasma etch.)

Figure 3F:
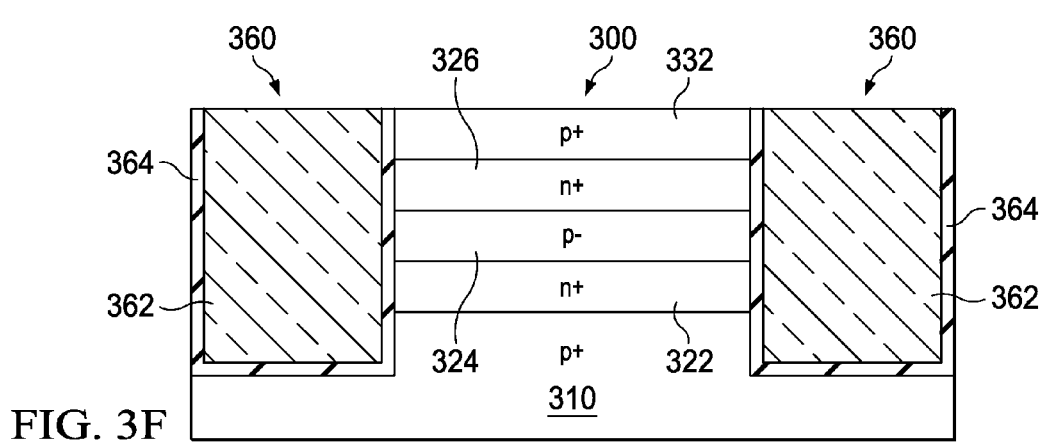

Next, as shown in FIG. 3F, after polycrystalline silicon layer 334 has been deposited, polycrystalline silicon layer 334 and the non-conductive layers 334 and 330 are planarized to expose the top surface of p+ layer 322 and form a trench isolation structure 360 that laterally and completely surrounds a portion of p+ substrate region 310, n+ lower epitaxial layer 322, p− middle epitaxial layer 324, n+ upper epitaxial layer 326, and p+ region 332. The layers can be planarized using, for example, chemical-mechanical polishing or an etch back. Trench isolation structure 360 includes a polycrystalline silicon core 362 that is isolated from p+ substrate region 310 by a non-conductive structure 364.

Figure 3G:
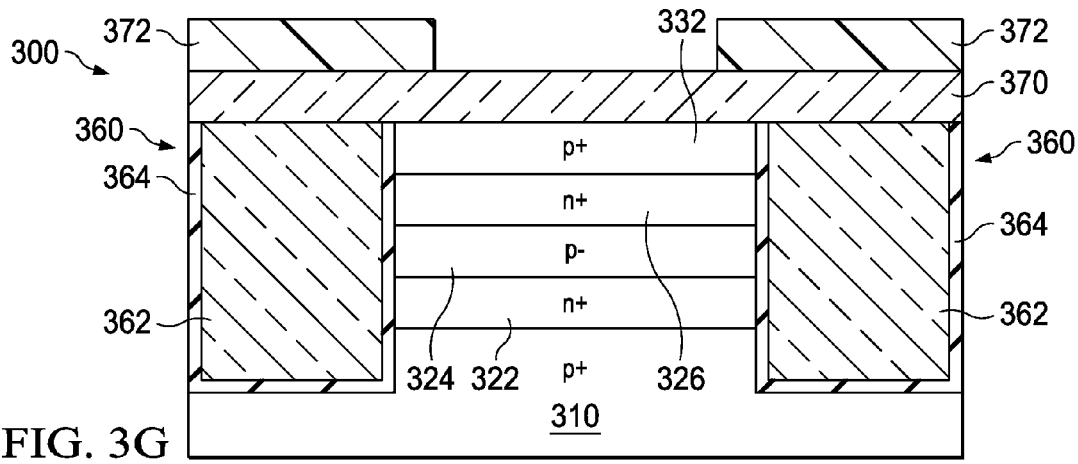

As shown in FIG. 3G, following the formation of trench isolation structure 360, a non-conductive layer 370 is deposited in a conventional fashion on p+ region 332. Non-conductive layer 370 can be implemented with, for example, borophosphosilicate glass (BPSG) which has been deposited and densified. Once non-conductive layer 370 has been formed, a patterned photoresist layer 372 is conventionally formed on non-conductive layer 370.

Figure 3H:
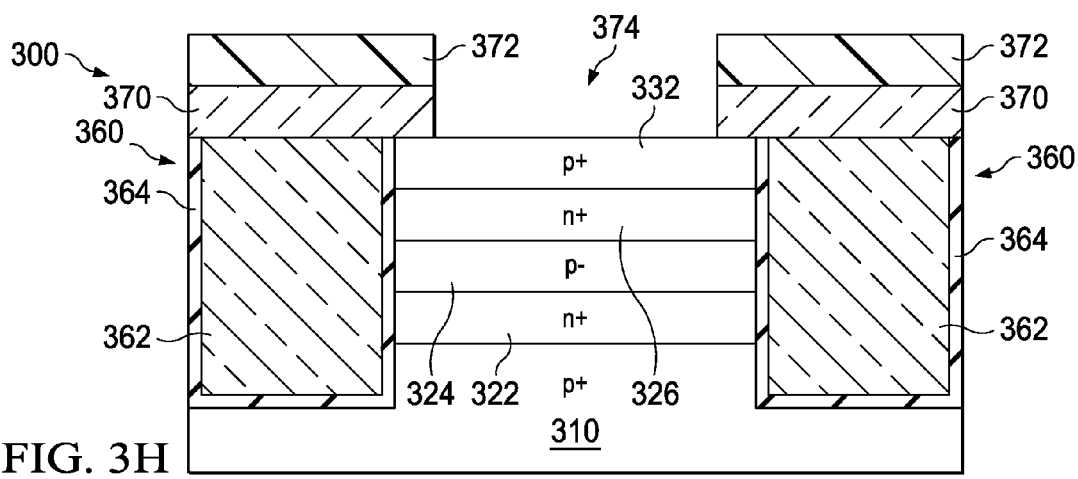

As shown in FIG. 3H, after patterned photoresist layer 372 has been formed, the exposed portion of non-conductive layer 370 is etched in a conventional manner to form an opening 374 that exposes the top surface of p+ region 332. Following the etch, patterned photoresist layer 372 is removed in a conventional fashion.

Figure 3I:
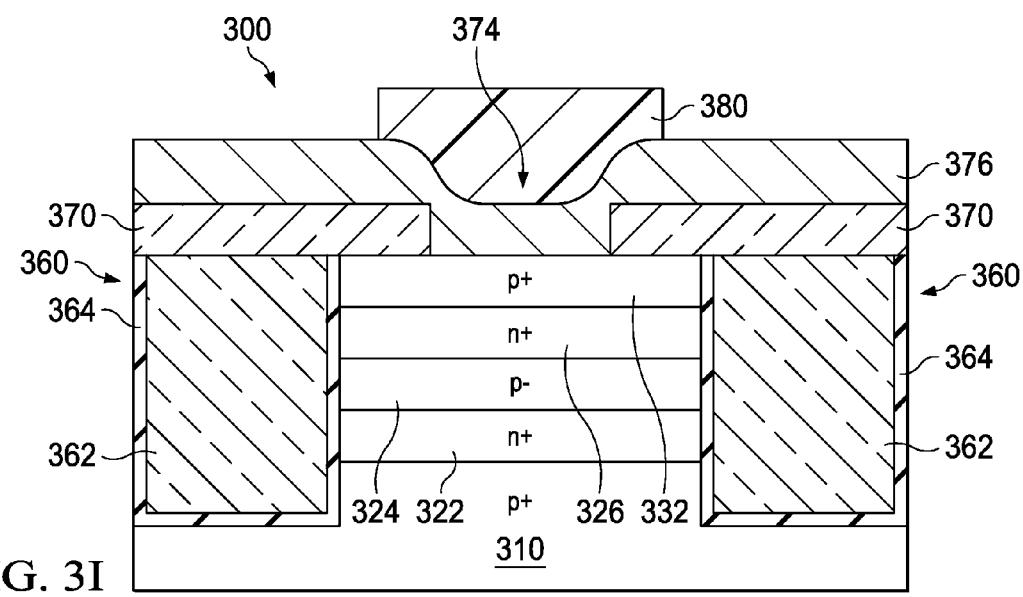

As shown in FIG. 3I, after patterned photoresist layer 372 has been removed, a metal layer 376 is formed to touch non-conductive layer 370, fill opening 374, and make an electrical connection with p+ region 332. Metal layer 376 can be implemented with, for example, a silicide layer, a layer titanium tungsten that touches and overlies the silicide layer, and a layer of aluminum that touches overlies the titanium tungsten layer.

The silicide layer can be implemented with, for example, platinum silicide, cobalt silicide, or titanium silicide. In addition, the silicide layer is conventionally formed, such as by depositing a metal, sintering the metal to form a silicide structure on each single-crystal silicon and polycrystalline silicon region covered by the metal, and then removing the metal from the non-conductive regions of the wafer. After metal layer 376 has been deposited, a patterned photoresist layer 380 is conventionally formed on metal layer 346.

Figures 3J, 3K:
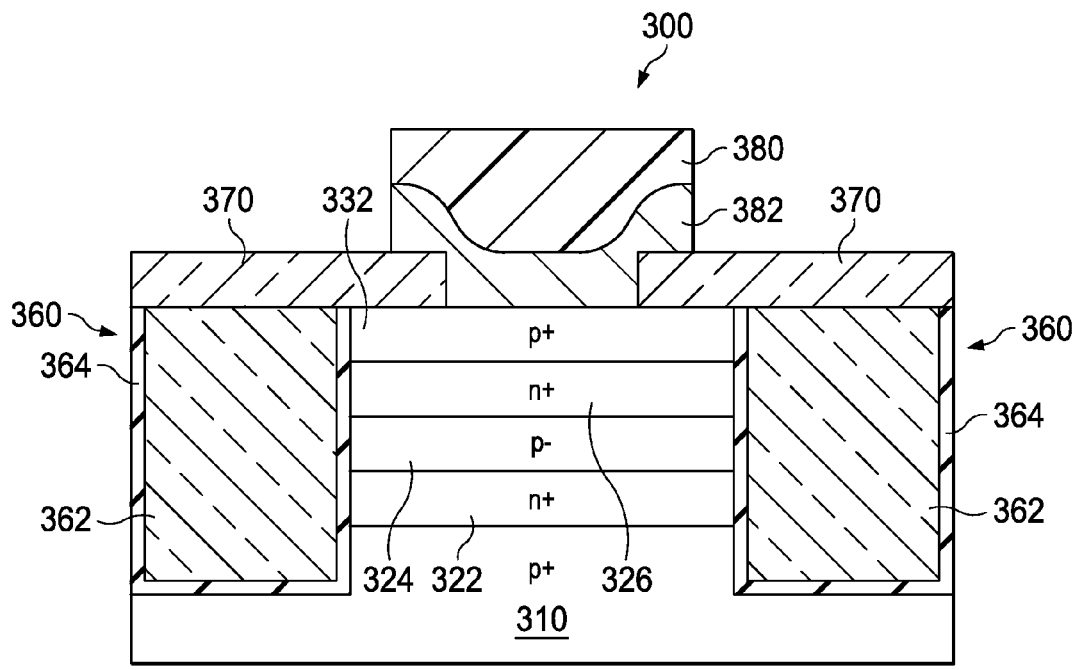

As shown in FIG. 3J, after patterned photoresist layer 380 has been formed, the exposed portion of metal layer 376 is etched in a conventional manner to form a metal contact 382 that touches the top surface of p+ region 332. Following the etch, patterned photoresist layer 380 is removed in a conventional fashion.

As shown in FIG. 3K, after patterned photoresist layer 380 has been removed, a non-conductive layer 384 is deposited to touch non-conductive layer 370 and metal contact 382. After non-conductive layer 384 has been deposited, a patterned photoresist layer 386 is conventionally formed on non-conductive layer 384.

Figure 3L:
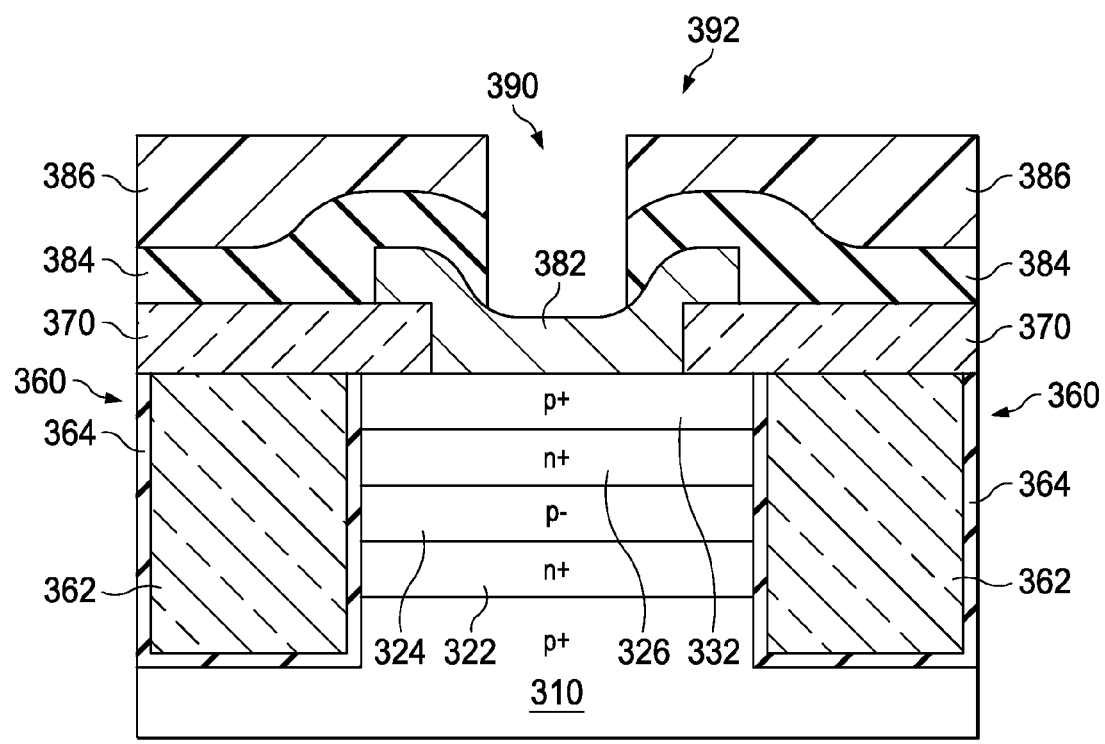

As shown in FIG. 3L, after patterned photoresist layer 386 has been formed, the exposed portion of non-conductive layer 384 is etched in a conventional manner to form an opening 390 that exposes the top surface metal contact 382. Following the etch, patterned photoresist layer 386 is removed in a conventional fashion to form a diode structure 392. After this, method 300 continues with conventional steps.

Thus, a bi-directional diode structure and a method of forming the bi-directional diode structure have been described. The bi-directional diode structure consumes substantially less silicon real estate than prior art bi-directional diode structures, and provides ultra-low capacitance by utilizing a p− epitaxial layer that touches and lies between two n+ epitaxial layers.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A diode structure comprising:
   a substrate region of a first conductivity type, the substrate region having a dopant concentration;
   a first semiconductor layer of a second conductivity type, the first semiconductor layer having a dopant concentration, and touching and lying over the substrate region;
   a second semiconductor layer of the first conductivity type, the second semiconductor layer touching and lying over the first semiconductor layer, the second semiconductor layer having a dopant concentration that is substantially less than the dopant concentration of the substrate region;
   a third semiconductor layer of the second conductivity type, the third semiconductor layer touching and lying over the second semiconductor layer; and
   a fourth semiconductor layer of the first conductivity type, the fourth semiconductor touching and lying over the third semiconductor layer, wherein:
   the second semiconductor layer lies completely between the first semiconductor layer and the third semiconductor layer; and
   the third semiconductor layer lies completely between the second semiconductor layer and the fourth semiconductor layer.

2. The diode structure of claim 1 wherein the third semiconductor layer has a dopant concentration substantially equal to the dopant concentration of the first semiconductor layer.

3. The diode structure of claim 2 wherein the fourth semiconductor layer has a dopant concentration substantially equal to the dopant concentration of the substrate region.

4. The diode structure of claim 3 and further comprising a metal contact that touches and lies over the fourth semiconductor layer.

5. The diode structure of claim 1 and further comprising a trench isolation structure that touches and laterally surrounds a portion of the substrate region, the first semiconductor layer, the second semiconductor layer, the third semiconductor layer, and the fourth semiconductor layer.

6. The diode structure of claim 5 wherein the trench isolation structure includes a polycrystalline silicon core and an isolation structure that lies between the polycrystalline silicon core and the substrate region.

7. The diode structure of claim 5 and further comprising:
   a first non-conductive layer that touches and lies over the fourth semiconductor layer; and
   a second non-conductive layer that touches and lies over the first non-conductive layer.

8. The diode structure of claim 7 wherein the metal contact touches and lies over a portion of the first non-conductive layer.

9. A bidirectional ESD diode structure comprising:
   a top diode, the top diode including a first p+ region touching and overlying a first n+ epitaxial layer, the first p+ region forming an anode;

a bottom diode, the bottom diode including a second n+ epitaxial layer touching and overlying a p+ substrate region;

a p– epitaxial layer between the top diode and the bottom diode, wherein the p– epitaxial layer separates the first n+ epitaxial layer from the second n+ epitaxial layer; and a metal contact in contact with the anode.

10. The bidirectional ESD diode structure of claim 9 wherein the first n+ epitaxial layer has a dopant concentration substantially equal to the dopant concentration of the second n+ epitaxial layer.

11. The bidirectional ESD diode structure of claim 10 wherein the first p+ region has a dopant concentration substantially equal to the dopant concentration of the p+ substrate region.

12. The bidirectional ESD diode structure of claim 11 wherein the p– epitaxial layer lies completely between the second n+ epitaxial layer and the first n+ epitaxial layer.

13. The bidirectional ESD diode structure of claim 12 wherein the first n+ epitaxial layer lies completely between the p– epitaxial layer and the first p+ region.

14. The bidirectional ESD diode structure of claim 13 and further comprising a trench isolation structure that touches and laterally surrounds a portion of the p+ substrate region, the second n+ epitaxial layer, p– epitaxial layer, first n+ epitaxial layer, and the first p+ region.

15. The bidirectional ESD diode structure of claim 14 wherein the trench isolation structure includes a polycrystalline silicon core and an isolation structure that lies between the polycrystalline silicon core and the p+ substrate region.

* * * * *